United States Patent
Rockenberger et al.

(10) Patent No.: US 8,796,125 B2
(45) Date of Patent: Aug. 5, 2014

(54) PRINTED, SELF-ALIGNED, TOP GATE THIN FILM TRANSISTOR

(75) Inventors: Joerg Rockenberger, San Jose, CA (US); James Montague Cleeves, Redwood City, CA (US); Arvind Kamath, Mountain View, CA (US)

(73) Assignee: Kovio, Inc., Sunnyvale, CA (US)

( * ) Notice: Subject to any disclaimer, the term of this patent is extended or adjusted under 35 U.S.C. 154(b) by 385 days.

(21) Appl. No.: 11/818,078

(22) Filed: Jun. 12, 2007

(65) Prior Publication Data

US 2007/0287237 A1  Dec. 13, 2007

Related U.S. Application Data

(60) Provisional application No. 60/813,161, filed on Jun. 12, 2006.

(51) Int. Cl.
*H01L 21/22* (2006.01)
*H01L 29/45* (2006.01)
*H01L 29/49* (2006.01)
*H01L 29/66* (2006.01)
*B82Y 10/00* (2011.01)
*H01L 29/786* (2006.01)

(52) U.S. Cl.
CPC ......... *H01L 29/458* (2013.01); *H01L 29/4908* (2013.01); *H01L 29/66757* (2013.01); *B82Y 10/00* (2013.01); *H01L 29/78681* (2013.01); *H01L 29/7869* (2013.01)
USPC .............................. 438/563; 438/149; 257/72

(58) Field of Classification Search
USPC .................................. 438/159, 563
See application file for complete search history.

(56) References Cited

U.S. PATENT DOCUMENTS

| | | |
|---|---|---|
| 4,868,014 A | 9/1989 | Kanai et al. |
| 5,573,964 A | 11/1996 | Hsu et al. |
| 5,770,490 A | 6/1998 | Frenette et al. |
| 5,817,550 A | 10/1998 | Carey et al. |
| 5,989,945 A | 11/1999 | Yudasaka et al. |
| 6,509,217 B1 | 1/2003 | Reddy |
| 6,511,910 B2 | 1/2003 | Asahina et al. |

(Continued)

FOREIGN PATENT DOCUMENTS

| | | |
|---|---|---|
| EP | 1085579 A1 | 3/2001 |
| EP | 1113502 A1 | 7/2001 |

(Continued)

OTHER PUBLICATIONS

G. A. C. M. Spierings, Wet chemical etching of silicate glasses in hydrofluoric acid based solutions, Journal of Materials Science, vol. 28, Issue 23, pp. 6261-6273, Dec. 1, 1993.*

(Continued)

*Primary Examiner* — Mark Tornow
(74) *Attorney, Agent, or Firm* — Murabito Hao & Barnes LLP; Andrew D. Fortney

(57) ABSTRACT

A self-aligned top-gate thin film transistor (TFT) and a method of forming such a thin film transistor, by forming a semiconductor thin film layer; printing a doped glass pattern thereon, a gap in the doped glass pattern defining a channel region of the TFT; forming a gate electrode on or over the channel region, the gate electrode comprising a gate dielectric film and a gate conductor thereon; and diffusing a dopant from the doped glass pattern into the semiconductor thin film layer.

28 Claims, 8 Drawing Sheets

(56) References Cited

U.S. PATENT DOCUMENTS

| | | | |
|---|---|---|---|
| 6,514,801 | B1 | 2/2003 | Yudasaka et al. |
| 6,518,087 | B1 | 2/2003 | Furusawa et al. |
| 6,593,591 | B2 | 7/2003 | Yudasaka et al. |
| 6,723,587 | B2* | 4/2004 | Cho et al. ............... 438/151 |
| 6,767,775 | B1 | 7/2004 | Yudasaka et al. |
| 6,767,839 | B1 | 7/2004 | Hagiwara |
| 6,864,133 | B2 | 3/2005 | Aoki et al. |
| 6,884,700 | B2 | 4/2005 | Aoki et al. |
| 6,908,796 | B2 | 6/2005 | Furusawa |
| 6,943,371 | B2 | 9/2005 | Chen et al. |
| 6,994,414 | B2 | 2/2006 | Hashimoto et al. |
| 7,052,980 | B2 | 5/2006 | Aoki |
| 7,141,492 | B2 | 11/2006 | Yudasaka |
| 7,435,668 | B2 | 10/2008 | Machida et al. |
| 7,767,520 | B2 | 8/2010 | Kamath et al. |
| 2002/0074547 | A1 | 6/2002 | Yudasaka et al. |
| 2002/0105033 | A1 | 8/2002 | Zhang |
| 2002/0179906 | A1 | 12/2002 | Yudasaka et al. |
| 2003/0030689 | A1 | 2/2003 | Hashimoto et al. |
| 2003/0085057 | A1 | 5/2003 | Hashimoto |
| 2003/0134519 | A1 | 7/2003 | Yudasaka et al. |
| 2003/0234398 | A1 | 12/2003 | Aoki et al. |
| 2004/0029364 | A1* | 2/2004 | Aoki et al. ............... 438/478 |
| 2004/0248429 | A1 | 12/2004 | Aoki |
| 2005/0059193 | A1* | 3/2005 | Yoneya ............... 438/151 |
| 2005/0090092 | A1 | 4/2005 | Lee |
| 2005/0133790 | A1 | 6/2005 | Kato |
| 2005/0148121 | A1 | 7/2005 | Yamazaki et al. |
| 2005/0176183 | A1 | 8/2005 | Aoki |
| 2005/0181566 | A1 | 8/2005 | Machida et al. |
| 2005/0287825 | A1 | 12/2005 | Ogata et al. |
| 2006/0008956 | A1 | 1/2006 | Yudasaka et al. |
| 2008/0135890 | A1 | 6/2008 | Nakagawa et al. |

FOREIGN PATENT DOCUMENTS

| | | | |
|---|---|---|---|
| EP | 1775775 | A1 | 4/2007 |
| JP | 8-32085 | A | 2/1996 |
| JP | 11251259 | A2 | 9/1999 |
| JP | 2000-22161 | A | 1/2000 |
| JP | 2001185731 | A | 7/2001 |
| JP | 2002-324907 | A | 11/2002 |
| JP | 2003-318120 | A | 11/2003 |
| JP | 2003-318191 | A | 11/2003 |
| JP | 2003-318193 | A | 11/2003 |
| JP | 2004103963 | A2 | 4/2004 |
| JP | 2006140335 | A | 6/2006 |
| KR | 2000-0062450 | A | 11/2000 |
| KR | 2005-0081174 | A | 8/2005 |
| WO | 0059044 | A1 | 5/2000 |
| WO | 00/59040 | | 10/2000 |
| WO | 00/59041 | | 10/2000 |
| WO | 2005119788 | A1 | 12/2005 |

OTHER PUBLICATIONS

Machine translation of Yudasaka JP11-251259.*
Takashi Aoki, Masahiro Furusawa and Kazuo Yudasaka; Device, Its Manufacturing Method, Electrooptical Device, and Electronic Device; Patent Abstracts of Japan; Publication No. 2003318191 A; Publication Date: Nov. 7, 2003; Japanese Patent Office, Japan.
Takashi Aoki, Masahiro Furusawa and Kazuo Yudasaka; Method for Manufacturing Device, Device and Electronic Apparatus; esp@cenet database; Publication No. JP2003318120; Publication Date: Nov. 7, 2003; http://v3.espacenet.com/textdoc?DB=EPODOC&IDX=JP2003318120&F=0, esp@cenet database—Worldwide.
Yutaka Kitsuno, Kotaro Yano, Akira Sakawaki and Keiji Kawasaki; Manufacture of Thin Film Transistor; Patent Abstracts of Japan; Publication No. 08-032085; Publication Date: Feb. 2, 1996; Japanese Patent Office, Japan.
Ichio Yudasaka, Tatsuya Shimoda and Shunichi Seki; Method of Manufacturing Thin-Film Transistor; esp@cenet database; Publication No. WO0059041; Publication Date: Oct. 5, 2000; http://v3.espacenet.com/textdoc?DB=EPODOC&IDX=WO0059041&F=0, esp@cenet database—Worldwide.
Kazufumi Ogawa and Kazuyasu Adachi; "Thin-Film Transistor and Manufacturing Method Thereof"; esp@cenet; Japanese Publication No. JP2000022161 (A); Publication Date: Jan. 21, 2000; esp@cenet Database—Worldwide, http://v3.espacenet.com/publicationDetails/biblio?DB=EPODOC&adjacent=true&locale= . . .
Korean Office Action with English Translation; Dated Sep. 17, 2009; Korean Patent Application No. 10-2007-0057231; 5 pgs. total; Korean Intellectual Property Office, Republic of Korea.
Japanese Notice of Reasons for Rejection with English translation dated May 2, 2012; Japanese Patent Application No. 2007-155417; 10 pages; Japan Patent Office, Japan.
Sato Masaaki; "Method for Manufacturing Semiconductor Device and Manufacturing Apparatus of the Semiconductor Device"; Patent Abstracts of Japan; Japanese Publication No. JP 2004-103963 (A2); Publication Date: Apr. 2, 2004; Japan Patent Office, Japan.
Yudasaka Kazuo; "Method for Introducing Impurity to Semiconductor Layer, and Manufacture of Thin-Film Transistor and Semiconductor Device"; Patent Abstracts of Japan; Japanese Publication No. JP 11-251259 (A2); Publication Date: Sep. 17, 1999; Japan Patent Office, Japan.
Partial English Translation of Taiwanese Office Action, dated Mar. 2, 2011; Taiwanese Patent Application No. 096121120; Taiwanese Intellectual Property Office, Taiwan.
Notice of Reasons for Rejection dated Jul. 26, 2011; Japanese Patent Application No. 2007-155417; Japan Patent Office, Japan.
Junji Yagishita, Tomohiro Saito and Kyoichi Suguro; "Semiconductor Device and Its Manufacturing Method"; Espacenet; Japanese Publication No. JP 2001185731 (A); Publication Date: Jul. 6, 2001; Espacenet Database—Worldwide; http://worldwide.espacenet.com/.
Kazuo Yudasaka; "Complementary Transistor Circuit, Electro-Optical Device, Electronic Device, and Fabrication Process of Complementary Transistor"; Espacenet; Japanese Publication No. JP 2006140335 (A); Publication Date: Jun. 1, 2006; Espacenet Database—Worldwide; http://worldwide.espacenet.com/.
Kiyokazu Nakagawa, Keisuke Arimoto, and Minoru Mitsui; "Field Effect Transistor and Manufacturing Method Thereof"; esp@cenet; Abstract of Publication No. WO2005119788 (A1); Publication Date: Dec. 15, 2005; esp@cenet Database—Worldwide.
Masahiro Furusawa, Shunichi Seki, Satoru Miyashita, Tatsuya Shimoda, Ichio Yudasaka, Yasuo Matsuki, and Yasumasa Takeuchi; "Method of Manufacturing Solar Cell"; esp@cenet; Abstract of Publication No. WO0059044; Publication Date: Oct. 5, 2000; esp@cenet Database—Worldwide.
Kazuo Yudasaka, Masahiro Furusawa, and Takashi Aoki; "Device, Its Manufacturing Method and Electronic Device"; Patent Abstracts of Japan; Publication No. 2003318193 A; Publication Date: Nov. 7, 2003; Japan Patent Office, Japan.
Yasuo Matsuki, Yasuaki Yokoyama, and Yasumasa Takeuchi; "Method of Manufacturing Solar Battery"; Patent Abstracts of Japan; Publication No. 2002-324907; Publication Date: Nov. 8, 2002; Japan Patent Office, Japan.
Akio Machida, Takahiro Kamei, and Yoshiyuki Kawana; "Method for Doping Impurities for Performing Doping Process Without Using Toxic Impurity Gases, Method for Manufacturing Semiconductor Device, and Method for Manufacturing Electronic Application Apparatus"; Korean Patent Abstracts; Publication No. 1020050081174 A; Publication Date: Aug. 18, 2005; Korean Intellectual Property Office, Republic of Korea.
Hong Yong Jang; "Thin-Film Transistor and Its Manufacture"; Korean Patent Abstracts; Publication No. 1020000062450 A; Publication Date: Oct. 25, 2000; Korean Intellectual Property Office, Republic of Korea.
H. Somberg; "Ink Jet Printing for Metallization on Very Thin Solar Cells"; Global Voltaic Specialists, Inc.; pp. 666-667; IEEE 1990.
Ichio Yudasaka, Tatsuya Shimoda and Shunichi Seki; "Method of Manufacturing Thin-Film Transistor"; Publication No. WO0059040(A1); Publication Date: Oct. 5, 2000; Esp@cenet database; http://v3.espacenet.com/publicationDetails/biblio?DB=EPODOC&adjacent=true&locale= . . . ; World Intellectual Property Organization.

* cited by examiner

PRINTED, SELF-ALIGNED, TOP GATE THIN FILM TRANSISTOR

RELATED APPLICATIONS

This application claims the benefit of U.S. Provisional Application No. 60/813,161, filed Jun. 12, 2006, which is incorporated herein by reference in its entirety.

FIELD OF THE INVENTION

The present invention relates to a printed, self-aligned, top-gate thin film transistor (TFT), in which metal-containing inks can be used for printing the gate metal. In preferred embodiments, the metal-containing ink comprises metal nanoparticles. The present invention advantageously requires little or no high-temperature or laser activation processing after printing the metal ink.

DISCUSSION OF THE BACKGROUND

In a conventional top-gate TFT process, alignment between the gate and the source/drain regions is ensured by first patterning the gate material and using it as a mask for dopant implantation and/or activation. This approach poses challenges regarding the choice of the gate metal because it needs to be either reflective to (UV) laser irradiation (e.g., Al) or compatible with thermal dopant activation at temperatures higher than 600° C. (e.g., doped polysilicon or a refractory metal such as Mo, Pd or W).

Conventional printing technologies (e.g., ink-jetting) can be advantageous for manufacturing electronic devices, due to the high throughput of printing processes relative to photolithography. However, high-resolution printing techniques are typically limited with respect to the width of a printed line (about 10 µm or larger), due to the relatively large volume of the drops.

Thus, it would be desirable to develop a process for making TFTs that can form small (e.g., <10 µm) line-width structures such as gates using printing technology, and/or that is not restricted to certain gate materials such as aluminum, refractory metals or doped polysilicon.

SUMMARY OF THE INVENTION

One object of the invention is to provide a method of forming a thin film transistor (TFT), comprising: forming a semiconductor thin film layer; printing a doped glass pattern thereon, a gap in the doped glass pattern defining a channel region of the TFT; forming a gate electrode on or over the channel region, the gate electrode comprising a gate dielectric film and a gate conductor thereon; and diffusing a dopant from the doped glass pattern into the semiconductor thin film layer.

Another object of the invention is to provide a thin film transistor (TFT), comprising: semiconductor thin film layer; at least part of a doped glass pattern thereon, wherein at least two portions of the doped glass pattern define a gap over a channel region of the TFT; a gate electrode on or over a channel region of the semiconductor thin film layer, the gate electrode comprising a gate dielectric film and a gate conductor thereon; and dopant-containing regions in the semiconductor thin film layer on opposed sides of the channel region.

Another object of the invention is to provide a method of forming a thin film structure, comprising: forming a semiconductor thin film layer; printing a doped glass pattern thereon, a gap in the doped glass pattern defining a channel region of the TFT; and diffusing a dopant from the doped glass pattern into the semiconductor thin film layer.

Another object of the invention is to provide a thin film structure, comprising: a semiconductor thin film layer; at least part of a doped glass pattern thereon, wherein at least two portions of the doped glass pattern define a gap over a channel region; and dopant-containing regions in the semiconductor thin film layer on opposed sides of the channel region.

In one respect, the present invention recognizes that the space between two lines may be smaller than the minimum width of an inkjet-printed line because the space between lines is mainly determined by ink placement accuracy plus the accuracy and addressability of the mechanical stages of the printer. Therefore, first printing a source/drain pattern which defines the location of subsequently deposited gate metal enables one to fabricate high performance printed top gate TFTs with channel widths <10 µm.

The present invention is therefore directed towards the manufacturing of thin film transistors and circuits thereof on various substrates including, but not limited to, glass (e.g., quartz) sheets or slips, plastic and/or metal foils, sheets or slabs, silicon wafers, etc., all of which may carry one or more buffer layers (such as silicon and/or aluminum oxide). Applications include but are not limited to displays, RF devices, sensors, etc.

DETAILED DESCRIPTION OF THE PREFERRED EMBODIMENTS

Figure 1A:
FIGS. 1A-E show cross-sectional views at various stages of an exemplary process flow process for making a printed self-aligned top gate device, showing a first dopant drive-in technique.

The development of printed refractory metal or Al gates in self-aligned top-gate TFTs poses a significant challenge, which the present invention avoids by first patterning a layer defining the source/drain regions, then activating the dopant (e.g., by annealing at high temperature or by laser activation), and subsequently depositing the gate metal precursor ink. In a preferred embodiment, simple noble metal inks containing silver or gold can be used for printing the gate metal, since no high-temperature or laser activation process step is required afterwards. The present TFTs may be capable of operating at GHz frequencies and may benefit from (1) narrow channel widths, (2) source and drain terminals that are self-aligned to the gate with a small amount of overlap between, and/or (3) high carrier mobility.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

For the sake of convenience and simplicity, the terms "coupled to," "connected to," and "in communication with" (and variations thereof) refer to direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition, coating, and printing, unless the context clearly indicates otherwise. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "(poly)silane" refers to compounds or mixtures of compounds that consist essentially of (1) silicon and/or germanium and (2) hydrogen, and that predominantly contain species having at least 15 silicon and/or germanium atoms. Such species may contain one or more cyclic rings. The term "(cyclo)silane" refers to compounds or mixtures of compounds that consist essentially of (1) silicon and/or germanium and (2) hydrogen, and that may contain one or more cyclic rings and less than 15 silicon and/or germanium atoms. The term "hetero(cyclo)silane" refers to compounds or mixtures of compounds that consist essentially of (1) silicon and/or germanium, (2) hydrogen, and (3) one or more dopant atoms such as B, P, As or Sb that may be substituted by a conventional hydrocarbon, silane or germane substituent and that may contain one or more cyclic rings. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width).

Representative cyclosilane compounds of the formula $(AH_z)_k$ wherein A is Si, z is 1 or 2 (preferably 2) and k is from 3 to 12 (preferably 4 to 8) and an exemplary method for their preparation are described in greater detail in copending application Ser. No. 10/789,317, filed Feb. 27, 2004, the relevant portions of which are incorporated herein by reference. Representative hetero(cyclo)silane compounds, doped silane intermediates, exemplary methods for their preparation, and techniques for determining and/or controlling the dopant levels in the precursor inks and active films are described in greater detail in copending application Ser. Nos. 10/950,373, 10/949,013 and 10/956,714, respectively filed on Sep. 24, 2004, Sep. 24, 2004 and Oct. 1, 2004, the relevant portions of which are incorporated herein by reference. Oligo- and polysilane compounds are disclosed in U.S. Provisional Appl. Nos. 60/850,094 and 60/905,403, filed Oct. 6, 2006 and Mar. 5, 2007, respectively, the relevant portions of which are incorporated herein by reference.

Typically, although not necessarily always, liquid-phase semiconductor inks further, comprise a solvent, preferably a cycloalkane (e.g., a mono- or bicycloalkane). Thus, when using an ink comprising or consisting essentially of a Group IVA element source (such as a silane-based precursor to Si or doped Si), forming the semiconductor layer may further comprise drying the liquid-phase precursor ink after deposition. See copending U.S. application Ser. Nos. 10/616,147, 10/789,317 and 10/789,274, respectively filed Jul. 8, 2003, Feb. 27, 2004 and Feb. 27, 2004, the relevant portions of each of which are incorporated herein by reference.

After deposition (and generally, at least some drying), a semiconductor layer is generally cured by heating, as described above in copending U.S. patent application Ser. No. 10/789,274 and 10/949,013, respectively filed on Feb. 27, 2004 and Sep. 24, 2004, the relevant portions of which are incorporated herein by reference) to form an amorphous, hydrogenated (doped) silicon (a-Si:H) layer. When a semiconductor layer originates or is formed from a (poly)silane, (cyclo)silane and/or hetero(cyclo)silane, the curing/heating step may remove unwanted precursor/ink components or byproducts such as volatile carbon-containing species, or reduce the hydrogen content of the a-Si:H layer (which is particularly advantageous if laser crystallization is to be used after semiconductor film formation). When a semiconductor layer originates or is formed from a hetero(cyclo)silane, the curing/heating step may also activate part of the dopant in the hetero(cyclo)silane, but in many embodiments, dopant activation may be more likely to occur during laser crystallization.

Also, a doped semiconductor layer may be deposited by local printing of the liquid semiconductor precursor ink directly onto a structure such as the gate metal (e.g., to form a silicide), dielectric layer (e.g., a gate dielectric) and/or semiconductor layer (see, e.g., copending U.S. patent application Ser. Nos. 10/949,013, 11/084,448 and 11/203,563, filed on Sep. 24, 2004, Mar. 18, 2005 and Aug. 11, 2005, respectively, the relevant portions of which are incorporated herein by reference). This approach to forming MOS TFT structures may be cost effective due to (i) the efficient usage of the semiconductor precursor materials and (ii) the combination of semiconductor deposition and patterning into one printing step.

Blanket deposition may comprise, e.g., evaporation, physical vapor deposition, sputtering, or chemical vapor deposition, as is known in the art. Alternatively, blanket deposition may comprise spin-coating an ink comprising, e.g., a (cyclo)silane, (poly)silane or metal nanoparticles (which may be passivated) and a solvent, and curing the ink (see, e.g., U.S.

Pat. No. 6,878,184 and U.S. patent application Ser. No. 10/749,876, filed Dec. 31, 2003, the relevant portions of which are incorporated herein by reference). Metals that may be deposited by such methods include elemental metals, such as aluminum, titanium, vanadium, chromium, molybdenum, tungsten, iron, nickel, palladium, platinum, copper, zinc, silver, gold, etc.; conventional alloys of such elements, such as aluminum-copper alloys, aluminum-silicon alloys, aluminum-copper-silicon alloys, titanium-tungsten alloys, Mo—W alloys, aluminum-titanium alloys, etc.; and electrically conductive metal compounds, such as the nitrides and silicides of elemental metals (e.g., titanium nitride, titanium silicide, tantalum nitride, cobalt silicide, molybdenum silicide, tungsten silicide, platinum silicide, etc.). In other embodiments, the blanket depositing step may comprise spin-coating an ink containing the metal-containing material, the metal-containing material may comprise metal nanoparticles and/or organometallic precursors of one or more of the metals disclosed above. Also, whether the metal ink is blanket-deposited or printed, the method may further comprise the step of curing or annealing the metal, organometallic precursor(s) and/or metal nanoparticles before or after the step of laser patterning.

This application describes the design of, and several process flows for fabricating, a printed, self-aligned, top gate TFT. The process flow leverages a printed doped glass in at least one of three ways:

A printed doped glass provides a source of dopants for source/drain doping;

The printed doped glass defines a space for gate metal and ensures close (e.g., reasonably acceptable) alignment of the gate to the source/drain regions/terminals; and/or The printed doped glass functions as an interlayer dielectric; a further interlayer dielectric may be formed over the doped glass pattern and the gate electrode. (In one embodiment, removing portions of the doped glass pattern leaves remaining portions of the doped glass pattern under an interlayer dielectric film.)

The present invention enables formation of gate line widths of less than 10 um, generally by forming a transistor gate in the space between printed structures. However, as drop volumes are expected to decrease and printing resolution is expected to increase in the future in widely-used printing techniques such as ink-jetting, gravure lithography, and offset lithography, the space between such printed structures is also expected to decrease, and the invention will continue to enable formation of gate widths less than the corresponding minimum width of a conventionally printed structure.

The invention, in its various aspects, will be explained in greater detail below with regard to exemplary embodiments.

Formation of a Self-Aligned Source/Drain Gate Structure

Dopant Drive-In through Gate Dielectric

Referring to FIGS. 1A-E, an exemplary process flow is shown. The exemplary process of FIGS. 1A-E forms the gate dielectric first, before printing a doped glass pattern. The transistor channel (e.g., comprising or consisting essentially of amorphous or polycrystalline silicon) is therefore protected from contamination by dopants from the subsequently deposited doped glass.

Referring to FIG. 1A, a physically isolated silicon film is generally formed by printing or coating a molecular and/or nanoparticle-based silicon ink on a substrate 1 and converting it to a (poly)silicon thin film 2 (e.g., by heating and/or curing it, and optionally, by crystallizing it by UV laser exposure, or thermal furnace or RTA anneal [optionally in the presence of a crystallization promoter such as Au, Ni, Al, etc.]). Alternatively, one may conventionally deposit a silicon film (e.g., by PECVD, LPCVD, sputtering, etc.), crystallize it as described above, and then pattern the polycrystalline film by low-resolution photolithography and/or selective etching (or vice versa; i.e., pattern, then crystallize the silicon film). When the silicon film is crystallized by laser annealing, one may simply remove the non-irradiated, amorphous portions of the deposited silicon film by selective etching in accordance with known techniques. The substrate preferably comprises a silicon wafer, a glass slip or sheet, or a plastic or metal sheet (which may optionally be stiff or flexible and which may have a dielectric layer thereon [e.g., in the case of metal, having a thin oxide layer thereon]).

Substrate 1 generally comprises a conventional mechanical support structure. Suitable electrically inert or inactive substrates may comprise a plate, disc, and/or sheet of a glass, ceramic, dielectric and/or plastic. Alternatively, suitable electrically conductive substrates may comprise a wafer, disc, sheet and/or foil of a semiconductor (e.g. silicon) and/or a metal. In the case where the substrate comprises a metal sheet and/or foil, the device may further comprise an inductor and/or capacitor, and the method may further comprise forming an inductor and/or capacitor from the metal substrate. However, any such electrically conductive substrate should have an insulator layer between it and any electrically active layer or structure thereover (e.g., semiconductor layer 2), except in a location where electrical contact is to be made from the devices on the insulator to a structure formed in the metal substrate (e.g., one or more metal pads of an interposer, inductor and/or capacitor for an EAS or RFID tag; see, e.g., U.S. patent application Ser. Nos. 10/885,283, 11/104,375 and/or 11/243,460, respectively filed on Jul. 6, 2004, Apr. 11, 2005, and Oct. 3, 2005, and/or U.S. Provisional Application Nos. 60/592,596 and 60/617,617, respectively filed on Jul. 31, 2004, and Oct. 8, 2004). Preferably, the substrate comprises a member selected from the group consisting of a silicon wafer, a glass plate, a ceramic plate or disc, a plastic sheet or disc, metal foil, a metal sheet or disc, and laminated or layered combinations thereof. For example, plastic substrates may further contain a planarization layer thereon to reduce the surface roughness of the substrate, and glass and plastic substrates may further contain a surface energy modifying layer of material thereon to improve the adhesion and/or control the spreading of a material (e.g., an ink) printed or otherwise deposited thereon (see U.S. Provisional Application No. 60/919,290, filed on Mar. 20, 2007). In addition, electrically conductive substrates (e.g., metal foils) generally have an insulator layer (e.g., a layer of the corresponding oxide) thereon, except in areas where circuitry formed thereon makes electrical contact with a structure (such as an inductor coil, antenna or capacitor plate) formed from the conductive substrate.

Forming the semiconductor thin film layer 2 may include printing a semiconductor precursor ink on substrate 1 to form a pattern, drying the ink, curing the ink (e.g., by heating and or annealing the dried ink for a length of time sufficient to cross-link, oligomerize and/or polymerize a silane therein, and/or increase an average molecular weight, increase a viscosity and/or reduce a volatility of the composition), then partially or substantially completely crystallizing the semiconductor film pattern to form a polycrystalline film. Alternatively, where applicable, one may simply print an amorphous film, without crystallizing it. The semiconductor thin film layer 2 generally comprises one or more Group IV elements, preferably polysilicon or silicon-germanium. Typical semiconductor layer 2 thicknesses may be from about 10, 30, 75 or 100 nm to about 200, 500 or 1000 nm, or any range of values therein. The film thickness may be chosen to optimize the electrical properties of the transistor.

In various embodiments, semiconductor layer 2 comprises or consists essentially of a lightly doped inorganic semiconductor material, such as one or more Group IVA elements (e.g., silicon and/or germanium), a so-called "III-V" material (e.g., GaAs), a II-VI (or chalcogenide) semiconductor, etc., further containing a dopant (such as B, P, As or Sb) in a concentration of from ~$10^{16}$ to ~$5 \times 10^{18}$ atoms/cm$^3$. Exemplary lightly doped semiconductor films are disclosed in copending U.S. application Ser. No. 10/949,013, filed Sep. 24, 2004, the relevant portions of which are incorporated herein by reference. In one embodiment, the semiconductor (transistor channel) layer 2 may be lightly doped (e.g., having a dopant concentration of from about $10^{16}$ to about $5 \times 10^{18}$ atoms/cm$^3$). When formed from a silane-based and/or nanoparticle ink, the lightly doped semiconductor layer 2 may have a concentration profile (e.g., dopant concentration as a function of semiconductor layer thickness) in an amorphous state that is substantially uniform throughout substantially the entire thickness of the semiconductor layer.

Figure 1B:
Figure 1C:
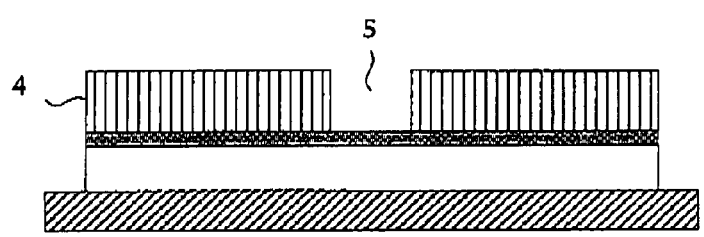

Referring to FIG. 1B, a gate dielectric 3 may be formed on the semiconductor (e.g., (poly)silicon) film 2 by thermal oxidation of the semiconductor layer 2, or alternatively, by printing or coating a suitable dielectric precursor and converting it to a dielectric film (e.g., liquid phase deposition of a SiO$_2$ precursor, such as silicic acid [H$_2$SiF$_6$] and boric acid) or deposition of other metal oxide(s) (e.g., titanium, zirconium, and [possibly] hafnium analogs of the silicic acid/boric acid mixture to form TiO$_2$, ZrO$_2$, HfO$_2$, etc.) or conventional CVD, PECVD, LPCVD or sputter deposition of silicon oxide and/or nitride layers. As shown in FIG. 1C, a doped glass film 4 is then printed (e.g., by ink-jetting, gravure printing, etc.) onto the gate dielectric 3. In one embodiment, the gate dielectric film 3 is formed on an entire surface of the semiconductor thin film layer 2, then a doped glass pattern 4 is printed thereon. The layout of the doped glass pattern is essentially the same as the intended layout for the source-drain structures of the TFT.

The gap 5 between the printed doped glass film regions defines the position of the gate metal. The width and/or spacing of the gap may range from 0.1-100 µm (preferably 1-10 µm, and in some embodiments, 1-5 µm). Upon high-temperature annealing, the dopant from the doped glass migrates through the gate dielectric into the polysilicon film, defining the source/drain regions 6. The temperature for diffusing the dopant from the doped glass through the gate dielectric is preferably lower than 1100° C., but at least about 700° C., for a length of time sufficient to dope the source/drain terminals, but leave channel region 7 undoped.

Preferably, the process of printing the doped glass utilizes a tool that can simultaneously deposit N- and P-type doped glass in different areas of the circuit. One embodiment utilizes, for instance, an inkjet printer with at least two inkjet heads on the same gantry, which are separated by a distance matching or corresponding to the distance (e.g. a multiple of such distance) between the areas of N- and P-type transistors in the circuit. The two inkjet (IJ) heads may correspondingly be connected to reservoirs of N- and P-type doped glass precursor (e.g., an ink comprising a doped spin-on glass precursor or other formulation) and may dispense N- and P-type doped glass in different areas of the circuit in the same printing pass.

Examples of precursors for the doped glass include conventional spin-on-dopant (SOD) formulations and customized versions with increased viscosity (e.g., "customized" by replacing or diluting the solvent in the conventional formulation with a similar or compatible solvent of higher viscosity), doped molecular silicon ink formulations which can be oxidized at low temperatures (e.g. ≤400° C.) after deposition (e.g. cyclic, linear or branched silane oligomers or polymers with dopant substituents, such as cyclo-Si$_5$H$_9$PR$_2$, wherein R is lower [C$_1$-C$_4$] alkyl, phenyl or C$_1$-C$_4$-alkyl substituted phenyl) or dopant precursors in the formulation (e.g. tert-butyl phosphine), oxidized doped molecular silicon ink formulations (e.g. oxidized versions of cyclic, linear or branched silane oligomers or polymers (e.g., cyclo-Si$_5$O$_5$H$_{10}$) with dopant precursors in the formulation (e.g. mono-, di- or tri-tert-butylphosphine or oxidized analogs thereof) or dopant substituents thereon, and glass forming formulations (e.g., so-called sol-gel formulations) containing phosphorous and boron compounds (e.g., organophosphates such as di-n-butylphosphate, etc.) and -borates (e.g. tri-t-butylborate, etc.). Suitable dielectrics also include compounds and/or polymers containing phosphorous and oxygen (which may further include silicon, carbon, hydrogen and/or nitrogen), boron (which may further include silicon, carbon, hydrogen, oxygen and/or nitrogen), arsenic and/or antimony (either of which may further include silicon, carbon, hydrogen and/or oxygen), etc. Exemplary phosphorous-containing dielectric precursors include:

inorganic oxophosphorous compounds and acids (e.g., P$_2$O$_3$, P$_2$O$_5$, POCl$_3$, etc.);
phosphosilicates;
monomeric, dimeric and/or oligomeric phosphates (e.g. meta- and/or polyphosphates);
phosphonates, phosphinates, and phosphines;
organic oxophosphorous compounds and acids (e.g., alkyl (aryl) phosphates, phosphonates, phosphinates and condensation products thereof); and
alkyl- and/or arylphosphonic and/or -phosphinic acids.

Exemplary boron-containing dielectric precursors include:
inorganic boron compounds and acids (e.g., boric acid, B$_2$O$_3$);
borosilicates, borazoles and polymers thereof;
boron halogenides (e.g., BBr$_3$);
boranes (e.g., B$_{10}$H$_{10}$), and sila- and/or azaboranes; and
organic boron compounds and acids (e.g. alkyl/aryl boronic acid, borates, boroxines and borazoles, borane addition complexes etc.).

Exemplary arsenic and/or antimony-containing dielectric precursors include:
oxo- and/or aza-analogs of the above compounds, such as As$_2$O$_3$ and Sb$_2$O$_3$; and
arsinosilanes, such as cyclo-As$_5$(SiH$_3$)$_5$.

Figure 1D:
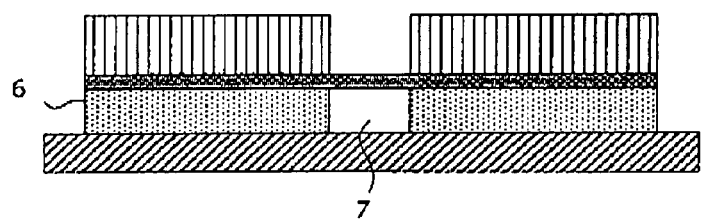

Thus, the source and drain terminals 6 in FIG. 1D may comprise (i) a Group IVA element, a III-V compound semiconductor such as GaAs, or a II-VI (or chalcogenide compound) semiconductor such as ZnO or ZnS, and (ii) a dopant element. Preferably, the semiconductor comprises a Group IV element (e.g., Si and/or Ge) and a dopant selected from the group consisting of B, P, As and Sb.

In various embodiments, the gate has a length of at least 0.1 microns, 0.5 microns, 1 micron, or 2 microns. In one implementation, the minimum gate length is about 5 microns. In the present disclosure, and consistent with gate dimensions as are known in the art, the gate length corresponds to the gap width or spacing. The gate may have a width of from about 1 µm to about 1000 µm or any range of values therein (e.g., from about 2 µm to about 200 µm, or from about 5 µm to about 100 µm, etc.), and a thickness of from about 10 nm to about 10,000 nm or any range of values therein (e.g., from about 50 or 100 to about 5000 nm, or from about 200 to about 2000 nm, etc.). The source and drain terminals 6 may have a thickness of from 10 to 1000 nm or any range of values therein (e.g., from 100, 200, or 250 Å to 10,000, 1000, or 500 Å), generally not to exceed the thickness of semiconductor layer 2.

Figure 1E:
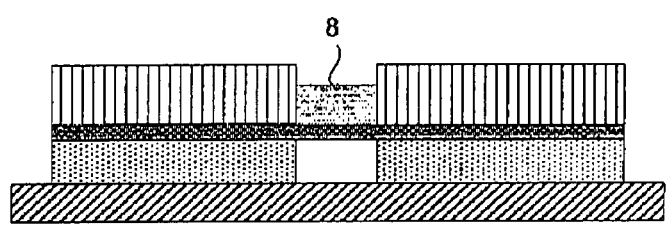

Referring now to FIG. 1E, the gate metal 8 may be printed by depositing a suitable gate metal precursor (e.g., an ink containing metal nanoparticles and/or an organometallic compound(s), a doped molecular and/or nanoparticle-based silicon ink(s), a silicide precursor ink(s), etc.) at least into the gap defined by the printed doped glass pattern, then converting it to a gate metal. Use of doped silicon inks may further require a high temperature anneal or laser irradiation to form polycrystalline silicon and/or to activate the dopant to achieve sufficient conductivity. Alternatively, a precursor for a seed layer (e.g., Pd) may be printed into the gap defined by the printed doped glass pattern, and the gate metal (e.g., Ag, Au, Cu, Pd, Pt, etc.) may be electroplated or electrolessly plated onto the seed layer. The seed layer may require an activation step before the plating process.

Printing of the gate metal precursor may include ink-jetting, gravure printing, offset lithography, etc. Furthermore (or alternatively), patterning the gate metal may include coating or printing the gate metal precursor and locally exposing it to laser radiation such that it changes its solubility characteristics in the exposed areas (see, e.g., U.S. patent application Ser. No. 10/722,255, 10/749,876, and 11/203,563, filed Nov. 24, 2003, Dec. 31, 2003 and Aug. 11, 2005, the relevant portions of which are incorporated herein by reference). Upon washing away the unexposed area, the irradiated gate metal precursor stays behind to form the gate metal, optionally after an additional curing or annealing step (so-called "negative" patterning and developing). Alternatively, "positive" patterning and developing may be employed, in which the area exposed to radiation is washed away. These embodiments (including the positive patterning embodiment) may provide advantages for the patterning of high-resolution metal gates which may not be directly achievable with direct printing methods. In general, the gate conductor comprises a metal. However, with respect to the gate, "metal" includes doped polysilicon.

A metal-containing ink (and, for that matter, any other printable ink disclosed herein) may be printed by essentially any conventional printing technology. For example, printing may comprise inkjet printing ("inkjetting"), screen printing, gravure printing, offset printing, flexography (flexographic printing), spray-coating, slit coating, extrusion coating, meniscus coating, microspotting, pen-coating, stenciling, stamping, syringe dispensing and/or pump dispensing the metal-containing ink in a predefined pattern. The ink may comprise or consist essentially of the metal precursor material and a solvent. The metal precursors that are generally compatible with printing or (selectively) plating may comprise organometallic compounds or nanoparticles (e.g., nanocrystals) of a metal such as titanium, copper, silver, chromium, molybdenum, tungsten, cobalt, nickel, gold, palladium, platinum, zinc, iron, etc., or metal alloys thereof, preferably silver or gold (or a metal alloy thereof). Such nanoparticles or nanocrystals may be conventionally passivated (e.g., with one or more surfactants), provided with one or more surface ligands (e.g., alkyl, aralkyl, alcohol, alkoxy, mercaptan, alkylthio, carboxylic acid and/or carboxylate groups bound thereto, or H atoms adsorbed thereon), or remain unpassivated. Plating may comprise, in one example, laser writing or printing a seed layer of metal (e.g., Pd; see U.S. Provisional Application No. 60/932,392, filed on May 30, 2007, the relevant portions of which are incorporated herein by reference) using nanoparticles and/or an organometallic compound of the metal, then selectively depositing (e.g., by electroless or electroplating) a bulk conductor (e.g., Co, Ni, Cu, etc.) onto the laser-written or printed seed layer. Alternatively, the ink may comprise or consist essentially of a conventional paste comprising a powder of one or more such metals or alloys thereof in a conventional binder.

The metal-containing ink may be dried by conventional and/or otherwise known processes. For example, metal precursor inks may be dried by heating the substrate containing the printed metal precursor ink thereon at a temperature and for a length of time effective to remove the solvent and/or binder. Suitable temperatures for removing solvents from a printed ink may range from about 50° C. to about 150° C., or any range of temperatures therein (e.g., from about 80 or 100° C. to about 120° C.). Suitable lengths of time for removing solvents from a printed ink at such temperatures may ranges from about 1 seconds to about 10 minutes, or any range of times therein (e.g., from about 10 or 30 seconds to about 5 minutes, or about 1 minute to 3 minutes, etc.). Such heating may take place on a conventional hotplate or in a conventional furnace or oven, optionally in an inert or reducing atmosphere.

The dried metal precursor from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying gate oxide. When the metal-containing ink is globally (blanket) deposited or printed, annealing is generally conducted to form a metal film on which a resist may be deposited for subsequent (laser) patterning (e.g., using conventional photolithography or laser resist processing, and/or other conventional processing. including developing, etching and/or stripping the resist). Also, when directly laser writing a metal precursor ink results in a patterned metal and/or metal precursor, annealing is generally performed to form a metal layer with improved conductivity, adhesion etc. Such annealing may comprise either annealing already-fused metal nanoparticles, or converting a patterned metal precursor layer into a patterned metal (which may include a metal silicide or doped polysilicon). Suitable annealing temperatures generally range from about 100° C. to about 500° C., or any range of temperatures therein (e.g., from about 150° C. to about 400° C.), although a temperature of up to 700° C. may be advantageous for formation of a metal silicide. Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, optionally in an inert or reducing atmosphere. Thus, the present method may further comprise the step of annealing the laser patterned metal gate sufficiently to improve its electrical, physical and/or adhesive properties.

In one embodiment, the gate metal precursor ink may de-wet from the printed doped glass pattern, which effectively confines it to the gap defined by the doped glass pattern. The doped glass pattern may be treated (e.g., by plasma exposure, coating with a fluorinated layer or other material having similar de-wetting properties, etc.) before deposition of the gate metal precursor ink to ensure de-wetting. Similarly, the gate metal precursor ink and/or the doped glass precursor may contain additives which ensure de-wetting of the gate metal precursor ink from the doped glass pattern. In an alternative embodiment, the gate metal precursor wets the printed doped glass pattern so that it extends beyond the area of the gap between portions of the doped glass pattern, and at least partially covers the doped glass pattern. This embodiment may be advantageous for decreasing the gate-induced drain leakage in the device.

An exemplary process flow for making thin film transistors in accordance with the present invention may therefore include the following steps:

Deposit or print lightly doped or undoped silane to form an amorphous Si thin film (Optional) Dehydrogenate amorphous Si Crystallize lightly doped or undoped amorphous Si (e.g., by [Excimer] laser treatment or furnace treatment)

Deposit, grow or otherwise form gate oxide (e.g., by thermal oxidation)

Print or otherwise pattern source and drain areas by depositing doped glass

Activate and/or diffuse dopants into source and drain areas (e.g., by heat treatment)

(Optional) Deposit metal seed layer

Deposit gate metal (Optional) Conventional gate metal annealing

Deposit passivation (e.g., oxide or nitride)

Oxide Formation after Printing Doped Glass

FIGS. 2A-E show an alternative process flow that advantageously combines gate dielectric formation by thermal oxidation of polysilicon with drive in of the dopants from the doped glass either in situ or in one process step. One important aspect of this second exemplary process, however, is to achieve gate oxide growth before significant dopant diffusion sets in.

A silicon film 12 is generally formed on substrate 11 by the same process as in FIG. 1A, by printing or coating a molecular and/or nanoparticle based silicon ink, then converting it to a silicon film, or by conventionally depositing a silicon film (e.g. PECVD, LPCVD, sputtering, etc.). In either case, the silicon film is generally crystallized by (UV) laser exposure, thermal furnace or RTA anneal (optionally in the presence of crystallization promoters such as Au, Ni, Al, etc.). Thereafter, referring to FIG. 2B, a doped glass 14 is printed (e.g. inkjetting, gravure or offset litho printing, etc.) onto the (poly) silicon film. The layout of the printed doped glass pattern is essentially the same as the intended layout for the source-drain regions. Alternatively, the printed doped glass pattern may correspond to lightly doped extension regions (e.g., a lightly doped drain) in the TFT, in which case a second doped glass pattern may be subsequently printed for forming the relatively heavily doped source/drain regions. The gap between the printed doped glass regions 14 generally defines the position of the gate metal and the gate dielectric. The width of the gap may range from 0.1-100 μm (preferably 1-10 or 1-5 μm), as described above. After printing, the doped glass pattern is optionally cured at temperatures low enough to ensure that substantially no dopant diffuses from the doped glass into the silicon film or into the gap defining the gate metal and dielectric. In one embodiment, a plurality of openings is made in the doped glass pattern, exposing surfaces of the dopant-containing (e.g., lightly doped) regions of the semiconductor thin film layer.

Figure 2A:
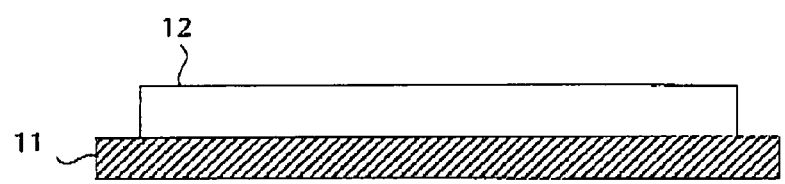
FIGS. 2A-E show cross-sectional views of another exemplary process flow, including gate oxide formation after the printing of doped glass.
Figure 2B:
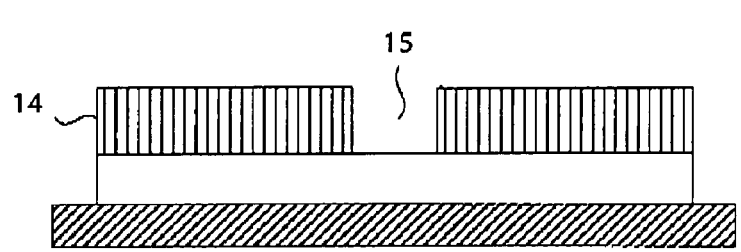
Figure 2C:
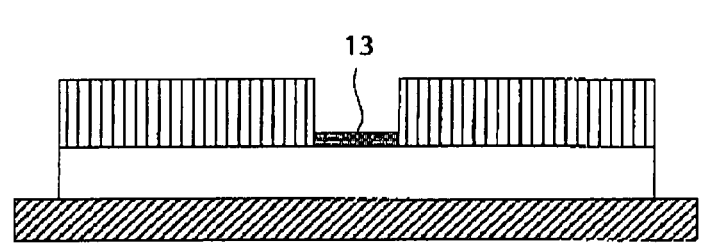
Figure 2D:
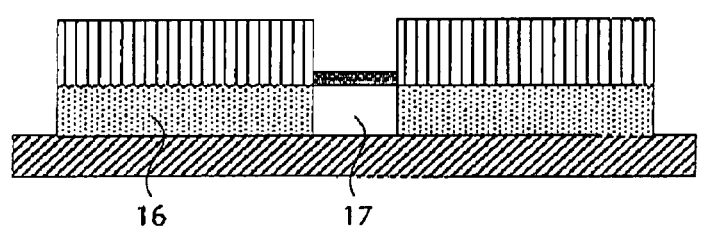

Referring to FIG. 2C, gate dielectric 13 may be formed by thermal silicon oxidation of the exposed poly-Si layer, printing or coating of a suitable dielectric precursor and converting it to a dielectric film, or liquid phase deposition of $SiO_2$ or other metal oxide (e.g., $TiO_2$, $ZrO_2$, $HfO_2$, etc.) or conventional silicon oxide and/or nitride deposition methods (e.g., PECVD, LPCVD, sputtering of an elemental target in the presence of an oxygen and/or nitrogen source, etc.). Preferably, silicon oxidation is employed.

Silicon oxidation in the exposed gate areas of the poly-Si film 12 can be accomplished by heating the film in a suitable atmosphere (air, $O_2$, ozone, $N_2O$, wet or dry steam, or a combination thereof) to a temperature higher than 600° C. The maximum temperature is preferably lower than 1000° C., more preferably lower than 900° C., to reduce, inhibit or prevent dopant diffusion from the doped glass into the channel region 17.

Alternatively, liquid phase deposition of $SiO_2$ (or other metal oxide[s]) may include growing an oxide layer in the exposed gate areas by hydrolysis of a saturated aqueous solution of hexafluorosilicic acid ($H_2SiF_6$) in the presence of boric acid at relatively moderate temperatures. This approach avoids the relatively high temperatures for thermal growth of an oxide layer (e.g., from silicon) and thereby reduces or eliminates the risk of dopant diffusing from the doped glass pattern into the channel region 17, potentially shorting the transistor.

The gate dielectric film 13 in the present electronic device may comprise any of the materials for the gate dielectric film described herein. The gate dielectric film 13 may have a width and length slightly less than the corresponding dimensions of the subsequently formed gate metal layer when it is wet etched, but the two layers will have substantially the same width and length when dry etched. The gate dielectric film 13 may have a thickness of from 20 Å to 1000 Å or any range of values therein (e.g., from 30 to 300 or 400 Å, or from 50 to 200 Å, etc.). Alternatively, a thicker gate dielectric layer (e.g., in the range of from 500 to 2000 Å, and in one implementation, on the order of about 150 Å) can be used, preferably using a material having a higher dielectric constant than silicon dioxide or aluminum oxide. In one embodiment, the gate dielectric film 13 has a thickness greater than the thickness of the heavily doped source and drain terminals, largely to minimize the possibility that source and drain terminals may form an electrical connection to gate metal layer. However, for high speed transistors, generally a thin gate dielectric film is preferred. Typically, after the gate oxide 13 is formed, referring now to FIG. 2D, the temperature is raised sufficiently (e.g., to >800° C.) to diffuse (or "drive") the dopant into the semiconductor film 12 to form source/drain regions 16. Further silicon oxidation at the elevated temperature may occur concurrently with driving in the dopant. The annealing temperature of the doped glass required to induce significant dopant diffusion is preferably higher than the temperature for forming a dielectrically effective gate dielectric, but not higher than the maximum processing temperature of the substrate (e.g., for a stainless steel foil, a temperature of not more than 1100° C.). However, for a metal foil of a relatively low melting point material such as aluminum, the maximum processing temperature is not more than about 600° C., and the gate oxide and dopant drive-in are performed at a relatively moderate temperature (and in the case of dopant drive-in, perhaps with use of a laser).

Figure 2E:
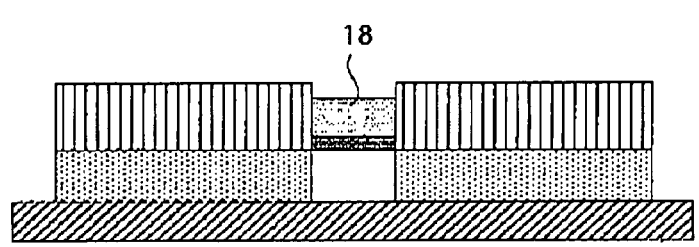

Thereafter, referring to FIG. 2E, gate metal 18 is formed in substantially the same manner as gate metal 8 of FIG. 1E.

Passivation of the Doped Glass Layer

Figure 3A:
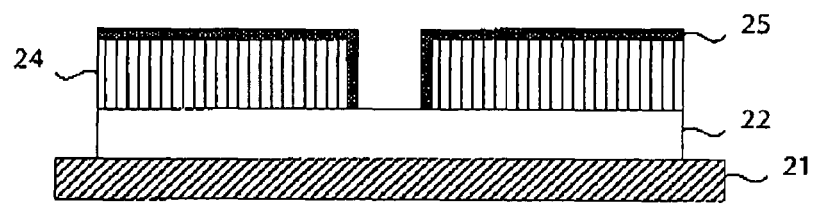
FIGS. 3A-C show cross-sectional views of a process flow that reduces potential out-diffusion from the doped glass during gate dielectric formation and (optional) further processing.
Figure 3B:
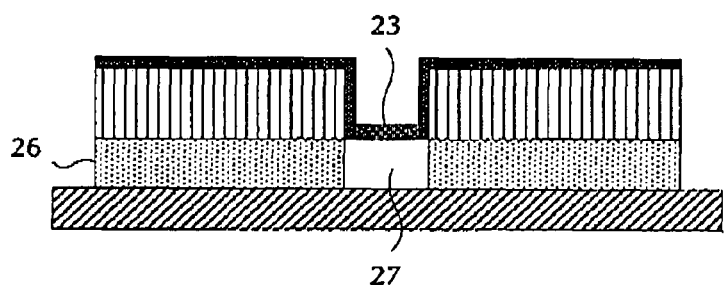
Figure 3C:
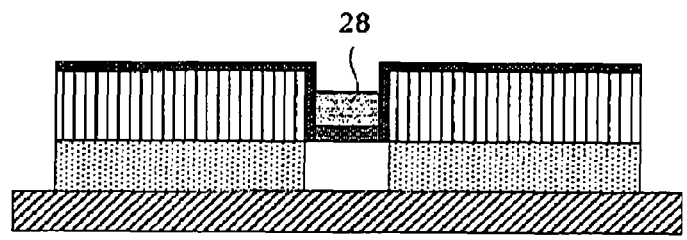

FIGS. 3A-C show a further alternative process flow that reduces the problem of potential out-diffusion from the doped glasses during gate dielectric formation by depositing a barrier and/or passivation layer 25 or generating a similar deactivated layer 25 on the doped glass. Thus, in a further embodiment, a thin dopant-depleted layer 25 is formed on top of the printed doped glass pattern 24. This layer is intended to prevent dopant diffusion into the channel region 27 during dopant activation. The formation of this layer can be accomplished in various ways (e.g., depositing an essentially undoped glass [acting as a buffer] or a silicon nitride film). Films which effectively getter typical dopants (e.g. phosphorus or boron) may also be used. Alternatively, a surface layer depleted of dopant may be generated by exposing the patterned doped glass film to hot water or water vapor, which extracts some of the dopant from the exposed surface(s) but leaves sufficient dopant in the bulk of the glass (particularly adjacent to the interface with underlying silicon 22) to be useful for source/drain doping. Furthermore, the thin passivation and/or dopant-depleted layer 25 may be formed by exposing the patterned glass film to conditions which change its surface characteristics, such as to prevent significant dopant diffusion into the channel, e.g. by exposing it to ozone, $N_2O$, water, etc.

Referring now to FIG. 3A, a passivation or barrier layer 25 (which can be a dopant-depleted layer or an undoped passivation layer) can be applied or formed prior to dopant drive-in at a temperature far below the temperatures typically employed to induce dopant diffusion. Such a barrier layer effectively prevents diffusion of the dopant from the doped glass 24 at elevated temperatures into adjoining structures (e.g., the top of the poly-Si channel 27 [see FIG. 3B] or the subsequently formed gate dielectric 23 and/or interlayer dielectric). Preferably, the passivation/barrier layer 25 consists essentially of an undoped silicon oxide that does not present a barrier for the subsequent gate dielectric formation. A process capable of producing a barrier layer comprises liquid phase deposition of $SiO_2$ from suitable precursor(s) (e.g., from an aqueous mixture of hydrofluorosilicic acid and boric acid), which can produce thin layers of high quality (gate) dielectric at moderate temperature. Alternatively, one may form passivation layer 25 by hydrolysis of a tetraalkylsiloxane or tetraalkoxysilane or conventional leaching of the dopant from a surface layer of doped glass layer 24, in accordance with known methods (such as by conventional extraction with water).

Referring now to FIG. 3B, in the case of a gate dielectric formed by printing or coating a suitable gate dielectric precursor and subsequent curing/annealing (e.g., using liquid phase deposition or conventional methods), the lateral extent of the layer need not be confined to the gap between the doped glass pattern/structures 24. In fact, in some instances, it may be preferable that at least parts of the gate dielectric layer 23 cover the surface of the doped glass pattern completely or at least partially. In such cases, the gate dielectric layer itself might also provide a barrier/passivation layer 25 and reduce, inhibit or prevent out-diffusion of dopants from the doped glass layer 24 and/or source/drain patterns 26. Formation of source/drain regions 26 is substantially the same as for source/drain regions 16 in FIG. 1D.

In some cases, out-diffusion of dopant into the channel region 27 prior to oxidation may be desirable due to the enhanced oxidation rate of the doped material. This enhanced oxidation rate would give a thicker gate oxide 23 at the edge of the channel 27. This thicker dielectric reduces the electric field at the edge of drain 26, thereby reducing gate induced drain leakage (GIDL).

Referring now to FIG. 3C, the gate metal 28 is printed depositing a suitable gate metal precursor (e.g., metal nanoparticles and/or organometallic compound(s), doped molecular and/or nanoparticle-based silicon ink(s), silicide precursor ink(s), etc.) as described above into the gap 25 defined by the printed doped glass pattern 24 and converting it to the gate metal, as for gate metal 8 in FIG. 1E.

Formation of Source/Drain Contacts and Interconnections

The following process flows for the formation of source/drain contacts and interconnects can be used with any of the device structures and/or processes described above.

Gate as Mask for Source/Drain Contact Etch

Figure 4A:
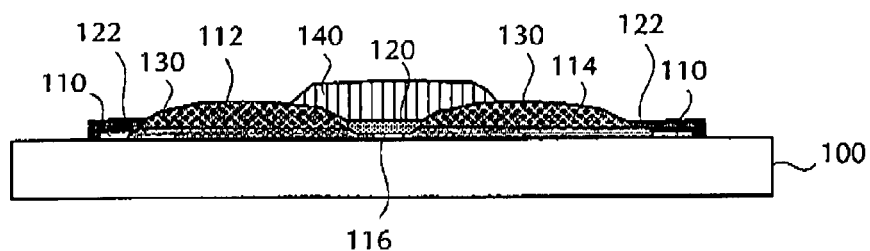
FIGS. 4A-D show cross-sectional views of a process flow for etching the doped glass pattern and forming source/drain contacts and interconnects, using the metal gate as a mask.

FIGS. 4A-D show an exemplary embodiment of a process for forming source/drain contacts and an interlayer dielectric (ILD) on the basic TFT structures of FIGS. 1-3. Referring to FIG. 4A, this exemplary process flow uses a printed metal gate 140, partially covering the doped glass pattern 130, as a mask for etching the doped glass pattern 130 to expose the contact areas of the source/drain regions 112 and 114. This embodiment ensures a relatively close distance of the source/drain contacts (thereby reducing the resistance) and enables an optional silicide on the source/drain contacts, as no organic ILD (interlayer dielectric) is present over the source/drain regions 112/114. Furthermore, extending the gate metal 140 beyond the area of the gate dielectric 120 and leaving some of the doped glass 130 under the gate metal 140 can reduce gate-induced drain leakage.

Source/drain regions 112/114 and channel 116 are formed on substrate 100 similarly to source/drain regions 6 and channel 7 of FIG. 1D. Undoped or lightly doped semiconductor layer portions 110 remain after drive-in of dopant from doped glass layer 130. Doped glass layer 130 remains after formation of source/drain regions 112/114. Gate dielectric 120 is formed similarly to gate dielectric 3 of FIG. 1C or gate dielectric 13 of FIG. 2C. For example, oxide layer 122 may be formed during oxidation of exposed surfaces of the semiconductor layer (e.g., 110) not covered by doped glass layer 130.

Figure 4B:

As shown in FIG. 4B, etching of the doped glass pattern 130 and exposed dielectric layer 122 is accomplished by exposure to one or more suitable etchants, including (but not limited to) HF-based wet etchants (e.g. buffered oxide etch [BOE]), native oxide etch [NOE], conventional pad etch, a conventional pyridine:HF etchant solution, etc.), HF-based or -producing vapors or gases, plasma etching, etc. The etchant is chosen such that the etch rate of the (gate) dielectric 122 and doped glass 130 is sufficiently larger than the etch rate of the underlying silicon (e.g., layers 110, 112 and 114) and metal gate layer 140 to enable substantially complete removal of the doped glass without any substantial removal of the silicon or gate metal.

Figure 4C:
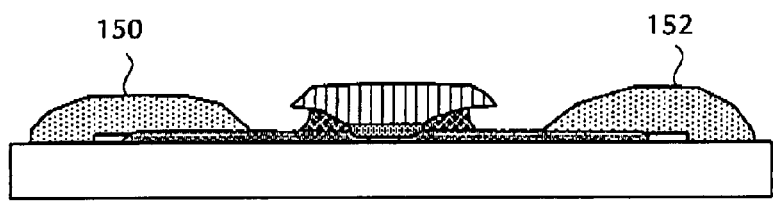

After etching and an optional cleaning step (not indicated), referring now to FIG. 4C, an interconnect metal 150/152 is printed on the exposed source/drain contacts. Although not shown in FIG. 4C, the interconnect metal is also printed onto the exposed metal, but in a "pad" region not in the plane of the page, as is known in the art. In one embodiment, the interconnect metal features 150 or 152 may also contact the gate metal 140 to form a diode-configured transistor (not shown). The printed interconnect metal is used to connect transistors within the same layer and/or to provide the lower contact area for a via structure. The resistance of the interconnect metal is preferably lower than 10 Ohm/square.

To ensure good contact, the structure of FIG. 4C may furthermore be annealed to form a silicide at the interface of the interconnect metal 150/152 with silicon, or throughout the entire film thickness of the contact areas between the interconnect metal 150/152 and the underlying silicon 112/114. Suitable silicide forming metals include but are not limited to Al, Ni, Pd, Pt, Mo, W, Ti, Co, etc. The interconnect metal may be chosen from such silicide forming metals. Alternatively, the interconnect metal precursor ink may contain additives which form silicides (e.g., silver inks doped with Ni organometallics) have been observed to lower the contact resistance between the interconnect 150/152 and doped silicon source/ drain regions 112/114. However, the additive (e.g., Ni) may segregate to the silicon interface and/or form a silicide.

Figure 4D:
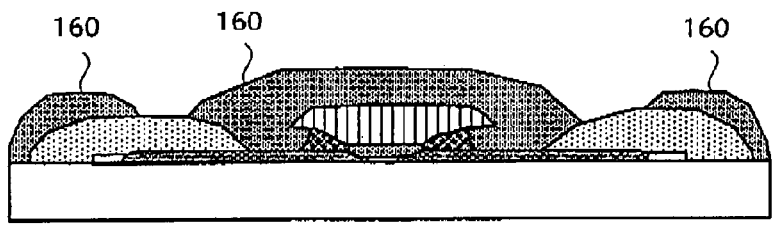

After printing the interconnect metal 150/152 (which may also be formed by more conventional processes, such as sputtering and photolithography, but printing is preferred), and referring now to FIG. 4D, an interlayer dielectric 160 is printed to cover any exposed active areas (e.g., the gate 140 and source/drain regions 112/114), but leaving via holes 162/164 in appropriate areas (e.g., over interconnect 150/152). The interlayer dielectric precursor may comprise a glass-forming formulation (e.g., a spin-on-glass formulation, such as a conventional organosilicate or organosiloxane), an organic dielectric (e.g., a polyimide, poly(benzocyclobutene) [BCB], etc.), an oxidized silicon precursor (e.g., an oxidized silane, such as $Si_5H_5(OH)_5$, etc.), or a molecular and/or nanoparticle based silicon formulation (e.g., a silane ink) which is oxidized after printing.

Printing the interlayer dielectric 160 may comprise inkjetting, gravure, offset printing, etc., similar to the other printable inks disclosed herein. Alternatively, patterning the interlayer dielectric may comprise printing or depositing an interlayer dielectric (e.g. UV- and/or IR-sensitized polyimide), and exposing it to radiation (e.g. IR, visible, or UV radiation) to change its solubility characteristic(s) in the irradiated areas. Exposing this layer to a suitable etchant or solvent (e.g., a developer) may remove the exposed (positive) or unexposed (negative) area of the interlayer dielectric forming via holes.

In an alternative embodiment, a sacrificial material may first be printed in locations corresponding to the locations of the later formed via holes in the interlayer dielectric. Then, an interlayer dielectric precursor as outlined above is printed or globally (blanket) deposited. Upon curing the interlayer dielectric precursor, the sacrificial material in the via areas may decompose, forming the via holes. Other means of removing the sacrificial material from the via hole are envisioned (e.g., selective etching, etc.). The circuit is completed by printing an interconnect metal connecting the respective contact pads in the open via-holes (see, e.g., FIGS. 7B-C and 8B-C). The same techniques and materials as outlined above can be utilized.

Conductors in communication with one of the source/drain terminals or the gate terminal may also be coupled to or continuous with another one of the conductors. For example, in a diode-configured transistor, a conductor may be in electrical communication with one source/drain terminal and the gate. In a capacitor-configured transistor, a conductor may be in electrical communication with both source/drain terminals. Alternatively, a thin dielectric layer may be formed over a source/drain terminal, and a conductor capacitively coupled to the underlying source/drain terminal may be formed thereover.

ILD as a Mask for Source/Drain Contact Etch

Figure 5A:
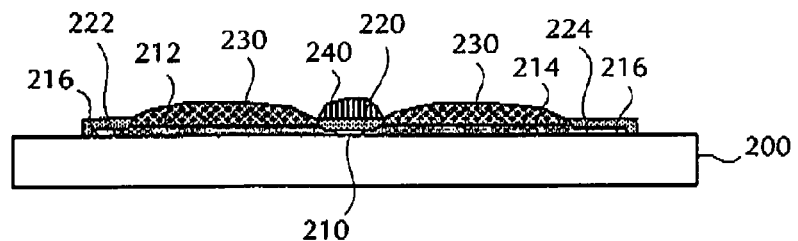
FIGS. 5A-E show cross-sectional views of an alternative process flow for forming source/drain contacts and interconnects.

FIGS. 5A-E show structures formed during an alternative process for making the present TFT. Referring to FIG. 5A, channel 210, first source/drain region 212, second source/drain region 214, and undoped semiconductor (e.g., Si) regions 216 are formed on substrate 200 as described herein. Doped glass 230 and conductive gate metal 240 are printed on or over substrate 200 as described herein, and gate dielectric 220 and thermal oxide (or other dielectric) 222/224 are formed as described herein.

Similar to the process of FIGS. 4A-E, the process of FIGS. 5A-E utilizes a gate 240 which is essentially confined to the area between printed doped glass regions 230 (as is gate dielectric 210) and does not cover the doped glass pattern 230. However, in this embodiment, a first interlayer dielectric 245 is deposited to protect the gate metal 240 and gate dielectric 220 during the etch of the doped glass pattern 230 to expose the source/drain regions 212/214 or contacts thereon (not shown).

Figure 5B:
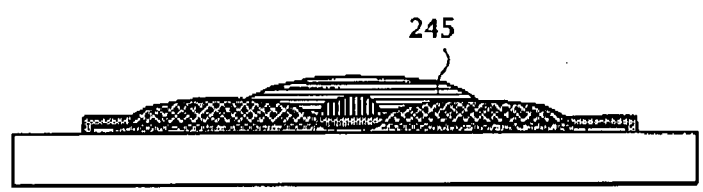

In FIG. 5B, first interlayer dielectric 245 is printed such that it completely covers the gate metal and dielectric 220, and at least partially but not completely the doped glass pattern 230. The precursor ink for first interlayer dielectric 245 may comprise glass-forming formulations (e.g., spin-on-glass formulations [e.g. silicates or organosiloxanes]), organic dielectrics [e.g., polyimide, BCB, etc.], oxidized silicon precursors [e.g., an oxidized silane such as $Si_5O_5H_{10}$]), or molecular and/or nanoparticle based silicon formulations which are oxidized after printing, as described elsewhere herein.

Printing the first interlayer dielectric 245 may comprise inkjetting, gravure, offset printing, etc. Alternatively, patterning the interlayer dielectric may comprise printing or depositing an interlayer dielectric (e.g. UV- and/or IR-sensitized polyimide), and exposing it to radiation (e.g., IR, visible, or UV radiation) to change its solubility characteristic(s) in the irradiated areas. Exposing this layer to a suitable etchant or solvent (e.g., developer) will remove the exposed (positive) or unexposed (negative) area of the interlayer dielectric forming via holes.

Figure 5C:

Subsequently, as shown in FIG. 5C, the doped glass pattern 230 and thermal oxide regions 222 and 224 are etched sufficiently to remove thermal oxide regions 222 and 224 and expose the doped source/drain regions 212/214. Etching the exposed doped glass pattern 230 and the exposed thermal oxide 222/224 is accomplished by exposure to a suitable etchant, including but not limited to HF-based wet etchants (e.g. BOE, NOE, pad etch, pyridine:HF, etc.), HF-based or -producing vapors or gases, plasma etching, etc., and generally for a length to time sufficient to remove thermal oxide regions 222 and 224, but keep some portion of the first interlayer dielectric 245 remaining over the gate metal 240. In many embodiments, some portion of doped glass pattern 230 also remains over the doped source/drain regions 212/214. The etchant may be non-selective between the doped glass pattern 230 and the first interlayer dielectric 245, the doped glass pattern 230 and thermal oxide regions 222/224, or all three materials (i.e., the doped glass pattern 230, the first interlayer dielectric 245, and thermal oxide 222/224), but the etchant generally is chosen such that the etch rate of the doped glass 230 and thermal oxide 222/224 is sufficiently larger than the etch rate of the underlying semiconductor (e.g., source/drain regions 212/214 and undoped semiconductor regions 216) to enable substantially complete removal of the thermal oxide 222/224 without any substantial removal of the underlying semiconductor.

Thus, depending on the etch time, the etchant may remove only relatively narrow portions of the doped glass pattern 230, exposing only a small boundary or area of the source/drain regions 214/216. In this case, all materials mentioned above are suitable for the first interlayer dielectric 245, as long as its thickness is sufficient to protect the gate metal and dielectric given its potentially low etch selectivity relative to the doped glass 230.

Figure 6A:
FIGS. 6A-C show cross-sectional views of an alternative process flow in which a dielectric material over the metal gate is used as a mask when etching the doped glass pattern and forming source/drain contacts and interconnects.

Alternatively, and referring now to FIG. 6A, the etch time may be chosen such that essentially most of the doped glass pattern is removed and a small amount of doped glass (or other insulator) 232 remains adjacent to the gate metal 240 and gate dielectric 220. In this case, the interlayer dielectric 245 is chosen such that it has a negligible etch rate compared to the etch rate of the doped glass pattern. For example, an organic insulator (e.g. polyimide, BCB etc.) may be chosen in this embodiment. In those embodiments employing a passivation and/or dopant-depleted layer on the printed doped glass pattern (see, e.g., FIGS. 3A-3C), the undoped passivation/dopant-depleted layer can be selected such that it has a negligible etch rate compared to the etch rate of the doped glass pattern in the presence of the doped glass etchant.

Subsequently, the doped glass pattern 230 (see FIG. 5B) is etched to expose the source/drain regions 212/214 and leave doped glass "remainders" 232 (see FIG. 6A). Etching the doped glass pattern and the exposed thermal oxide regions 222/224 is accomplished substantially as described herein, but the etchant is chosen such that the etch rate of the doped glass and thermal oxide 222/224 is selective with respect to the interlayer dielectric layer 245 (e.g., the etch rate ratio of the doped glass and thermal oxide 222/224 to the interlayer dielectric layer 245 is sufficiently large to enable substantially complete removal of the exposed doped glass without any substantial removal of the interlayer dielectric layer 245). In embodiments where the doped glass pattern 230 comprises or is based on a doped silicon oxide, and source/drain regions 212/214 and undoped semiconductor regions 216 comprise or consist essentially of silicon, the interlayer dielectric layer 245 may comprise silicon nitride.

Figure 5D:
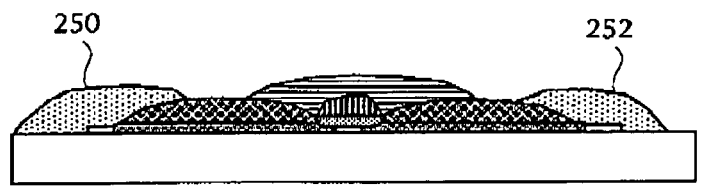
Figure 6B:
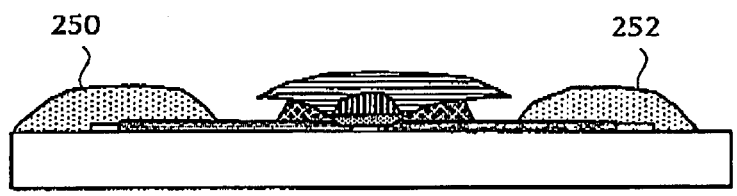

Referring now to FIGS. 5D and 6B, after etching the doped glass 230 and thermal oxide 222/224, the substrate may be (optionally) cleaned, and an interconnect metal 250/252 is printed on the exposed source/drain regions 212/214, respectively. As described elsewhere herein, the interconnect metal 250/252 may also contact the gate metal 240 (not shown). The printed interconnect metal 250/252 is used to connect transistors within the same layer and/or to provide a lower-resistance contact area for an overlying via structure. If the interlayer dielectric 245 is chosen to be compatible with subsequent high-temperature processing (e.g., a silicate, silicon nitride, etc.), a metal silicide can be formed at the interface between the interconnect metal 250/252 and source/drain region 212 and undoped semiconductor 216 on one side of the gate metal 240 and source/drain region 214 and undoped semiconductor 216 on the other side. The resistance of the interconnect metal is preferably lower than 10 Ohm/square.

Printing and forming the interconnect metal may include printing a suitable interconnect metal precursor (e.g. metal nanoparticles or organometallic compound(s), silicide precursor ink(s), etc.) and converting it to the interconnect metal, largely as described herein. Alternatively, a precursor for a seed layer can be printed on the contact areas and converted to a seed layer, then the interconnect metal (e.g., Ag, Au, Cu, Pd, Pt, etc.) can be electroplated or electrolessly plated on the seed layer. The seed layer may require an activation step before the plating process.

Alternatively, patterning of the interconnect metal may include coating or printing the interconnect metal precursor and locally exposing it to laser radiation such that the solubility characteristics of the printed interconnect metal precursor changes in the exposed areas. Upon washing away either the exposed or unexposed area (preferably the unexposed area), the irradiated interconnect metal precursor stays behind to form the interconnect metal, optionally after an additional curing or annealing step. This embodiment may provide advantages for the patterning of high-resolution metal interconnect which may not directly be achievable with direct printing methods.

To ensure good contact, the structure may furthermore be annealed to form a silicide at the interface or throughout the entire film thickness of the contact areas between the interconnect metal and the silicon. Thus, in such an embodiment, the interlayer dielectric protecting the gate metal 240 during the etch of the doped glass pattern 230 is compatible with the silicidation temperature.

Figure 5E:
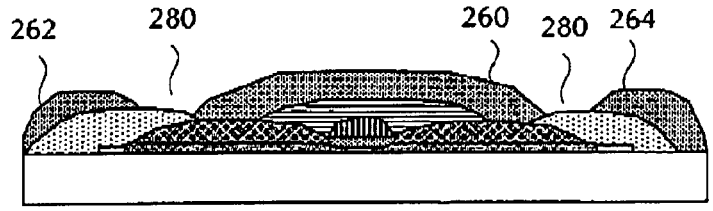
Figure 6C:
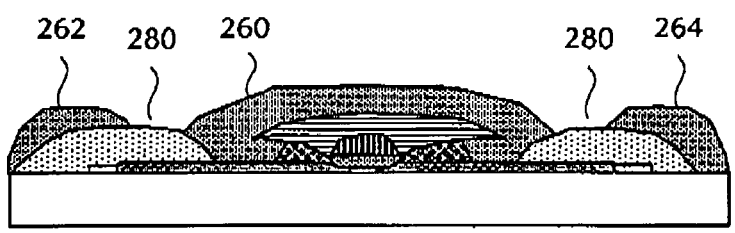

Referring now to FIGS. 5E and 6C, after printing the interconnect metal, a second interlayer dielectric 260/262/264 is printed over the gate 245 and source/drain regions 212/214, but leaving via holes 280 in appropriate areas for contact with an overlying level of metallization. The precursor for interlayer dielectric 260-264 may comprise the same or similar formulations as for first interlayer dielectric 245 (e.g., spin-on-glass formulations such as silicates or siloxanes, organic dielectrics such as polyimides, BCB, etc., oxidized silicon precursors such as oxidized silanes, etc.), or molecular and/or nanoparticle based silicon or aluminum formulations which are oxidized and/or nitrided after printing.

A Printed ILD as a Mask for Doped Glass Etching

The process flows of FIGS. 7A-7D and 8A-8D use a printed interlayer dielectric pattern 350/352/354 as a mask for etching the doped glass 330 in order to expose the source/drain regions 312 and 314. The process flows of FIGS. 7A-7D and 8A-8D differ from each other primarily in the etch selectivity of the doped glass pattern 330 relative to the first interlayer dielectric 350/352/354 (or, as shown in FIGS. 8A-8D, first interlayer dielectric 350'/352'/354'). In the process of FIGS. 7A-7D, the etch is selective, thereby enabling a thinner printed interlayer dielectric pattern 350/352/354 relative to the process of FIGS. 8A-8D. In the process of FIGS. 8A-8D, the etch is non-selective, thereby enabling a wider variety of possible materials for printed interlayer dielectric pattern 350'/352'/354' relative to the process of FIGS. 7A-7D.

Figure 7A:
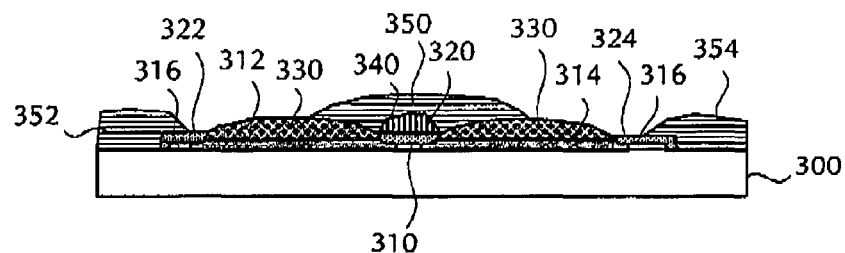
FIGS. 7A-D show cross-sectional views of an alternative process flow which uses a printed interlayer dielectric as a mask for etching the doped glass and exposing the doped polysilicon source/drain regions for subsequent contact/interconnect formation.
Figure 8A:
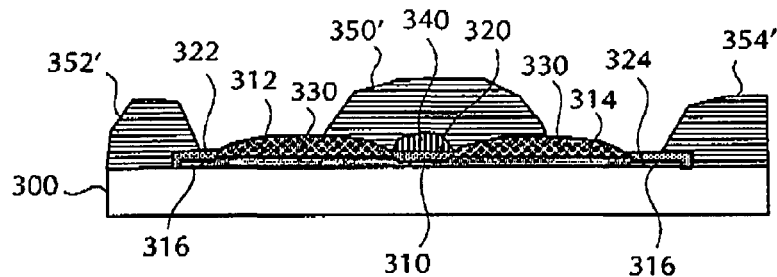
FIGS. 8A-D show cross-sectional views of a further alternative process flow which uses a printed interlayer dielectric as a mask for non-selectively etching the doped glass and exposing the doped polysilicon source/drain regions for subsequent contact/interconnect formation.

Referring to FIGS. 7A and 8A, a first interlayer dielectric 350/352/354 (or 350'/352'/354') can be printed such that it completely covers the gate metal 340 and the regions of substrate 300 that would otherwise be exposed, and partially (but not completely) covers the doped glass pattern 330 as well as the semiconductor island edges (e.g., 316). The precursor for the first interlayer dielectric 350/350' through 354/354' may comprise any of the dielectric-forming formulations described herein, as well as a nitride or oxynitride of silicon and/or aluminum. The interlayer dielectric may be printed or patterned as described herein.

Figure 7B:
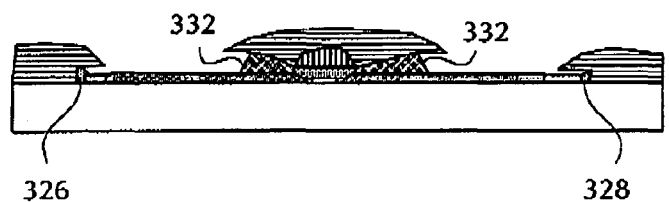
Figure 8B:
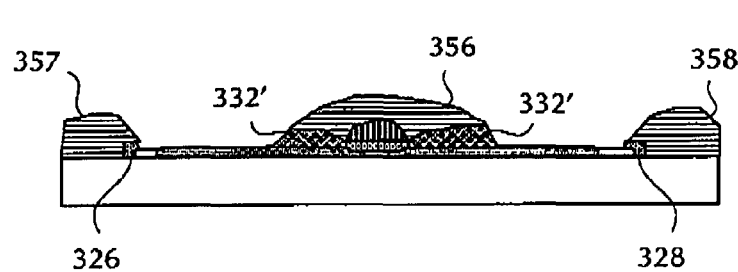

Subsequently, and as shown in FIGS. 7B and 8B, the exposed doped glass pattern 330 and thermal oxide 322/324 are etched to expose the source/drain regions 312/314 in areas substantially not covered by the first interlayer dielectric 350/352/354 (or 350'/352'/354'). The doped glass pattern 330 is etched as described elsewhere herein. In the process of FIG. 7B, the etchant is generally chosen such that the etch rate of the doped glass 330 and thermal oxide (or other dielectric) 322/324 is sufficiently larger than the etch rate of the first interlayer dielectric 350/352/354 and the underlying source/drain regions 312/314 to enable substantially complete removal of the doped glass 330 without any substantial removal of the first interlayer dielectric 350/352/354 or source/drain regions 312/314. In the process of FIG. 8B, the etchant is generally chosen such that the etch rate of the doped glass 330 and thermal oxide 322/324 is close to or substantially the same as the etch rate of the first interlayer dielectric 350'/352'/354', but relatively higher than the etch rate of the underlying source/drain regions 312/314. Depending on the choice of the interlayer dielectric and its thickness, the removal of the doped glass pattern may lead to undercut structures 332 (FIG. 7B) or 332' (FIG. 8B). However, when the etch selectivity of the doped glass to the first interlayer dielectric is low (e.g., as shown in FIG. 8B), there may be appreciable thinning of the first interlayer dielectric (compare the etched first interlayer dielectric 356/357/358 in FIG. 8B to the printed/patterned first interlayer dielectric 350'/352'/354' in FIG. 8A). In such a case, the printed/patterned first interlayer dielectric 350'/352'/354' may have a thickness that is greater than the thickness of doped glass 330 (e.g., by ≥1.5×, ≥2×, ≥3×, ≥5×, or ≥10×). As illustrated in FIG. 8B, this arrangement can avoid the formation of undercut structures 332.

In either case, the etch time is chosen such that most (but not the entire) doped glass layer is removed from over the source/drain regions 312/314. Specifically, a small amount of doped glass 332 adjacent to the gate metal 340 and gate dielectric film 320, covered by the first interlayer dielectric 350 or 350', remains.

Figure 7C:
Figure 8C:
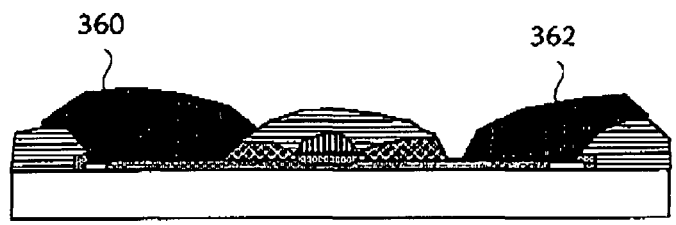

After etching and an optional cleaning step (not shown), an interconnect metal 360/362 can be printed on the exposed source/drain regions 312/314, as shown in FIGS. 7C and 8C. Furthermore, this interconnect metal may also contact the gate metal (not shown). The printed interconnect metal may be used to connect transistors within the same layer and/or to provide a lower contact area for a via structure. If the interlayer dielectric is compatible with subsequent high-temperature processing (e.g., a silicate, silicon nitride, etc.), silicidation of the source/drain contact may be possible after depositing the interconnect metal 360/362. The resistance of the interconnect metal is preferably lower than 10 Ohms/square. Printing and forming the interconnect metal may be performed as described elsewhere herein.

Figure 7D:
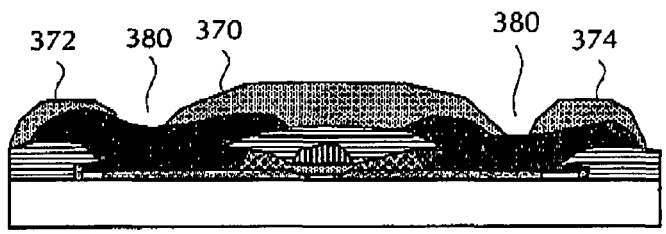
Figure 8D:
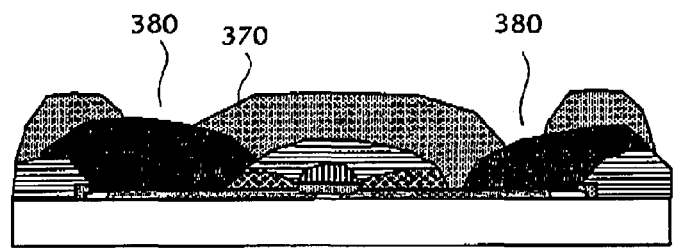

After printing the interconnect metal 360/362, as shown in FIGS. 7D and 8D, a second interlayer dielectric 370 may be printed covering the exposed active areas (e.g., the gate and source/drain regions), but leaving via holes 380 in appropriate areas. The precursor for the interlayer dielectric 370 may comprise the same dielectric-forming formulations and other materials as described herein for interlayer dielectrics.

In certain embodiments of the present process (not necessarily limited to FIGS. 7A-8D), laser patterning may comprise the substeps of depositing a resist material on the blanket deposited metal-containing layer, selectively irradiating portions of the resist material with a beam of light from a laser having (i) a predetermined width and/or (ii) a predetermined wavelength or wavelength band absorbed by the resist (or by an absorptive dye in the resist), developing the selectively irradiated resist with a developer to leave a pattern corresponding to the structure being formed (in the case of FIGS. 7A-8D, gate metal 340 and/or interconnect 360/362; note that these steps apply to both positive and negative resists), removing those portions of the blanket deposited material not corresponding to the desired or predetermined pattern (typically by dry or wet etching), and removing the remaining resist material. Preferably, the light has a wavelength in the infrared (IR) band, although it could also comprise a wavelength or wavelength band in the ultraviolet (UV) and/or visible band of the spectrum. In such a case, the resist (or dye) absorbs and/or is sensitive to that wavelength or band of light, and the light beam is focused on or directed at the desired or predetermined portions of the resist. Exemplary embodiments are disclosed in U.S. patent application Ser. No. 11/203,563, filed on Aug. 11, 2005, the relevant portions of which are incorporated herein by reference.

Alternatively, a semiconductor layer (e.g., having characteristics of the transistor channel 7, 17, 27, 116, 210, or 310, such a dopant level or concentration) may be formed by printing or coating the substrate with a doped or undoped semiconductor ink while simultaneously irradiating the ink/substrate. In one implementation, the process comprises spin-coating the ink containing a semiconductor precursor onto a substrate, while irradiating the ink with ultraviolet light during a substantial part of the spin-coating step. This technique (which, in the latter implementation, is sometimes known as "UV spin-coating") is described in greater detail in co-pending U.S. patent application Ser. No. 10/789,274, filed on Feb. 27, 2004, the relevant portions of which are incorporated herein by reference. In another implementation, printing (which may include simultaneous or immediately subsequent UV irradiation) comprises inkjetting or gravure, flexographic, screen or offset printing a doped or undoped semiconductor ink in locations on the substrate corresponding to active transistor regions (or other deposition technique for depositing material in selected areas of the substrate). In either case, the semiconductor layer generally has an amorphous morphology following deposition (with optional substantially simultaneous irradiation) and curing, and before further processing, it is generally crystallized (e.g., by heating or by laser irradiation; see, e.g., U.S. patent application Ser. Nos. 10/950,373 and 10/949,013, each of which was filed on Sep. 24, 2004, the relevant portions of which are incorporated herein by reference). In many cases, such crystallization will also activate at least some of the dopant.

CONCLUSION/SUMMARY

The present invention advantageously provides a low cost method for making printed self-aligned top-gate TFTs having reliable, commercially acceptable electrical characteristics (e.g., on/off speeds and ratios, carrier mobilities, $V_t$'s, etc.). The invention advantageously provides (1) results similar to structures formed by more conventional approaches, but at a much lower cost and at a much higher throughput (on the order of hours to days, as opposed to weeks to months) than conventional process technology, and (2) TFTs with higher resolution patterning capability and similar or higher throughput as compared to conventional graphic arts printing technology (e.g., inkjetting).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

The invention claimed is:

1. A method of forming a thin film transistor (TFT), comprising:
   a) forming a semiconductor thin film layer;
   b) prior to forming a gate electrode of the TFT, printing a doped glass formulation in a pattern on or over the semiconductor thin film layer, the printed doped glass pattern having a gap therein exposing a portion of the semiconductor thin film layer and defining at least one dimension of at least part of the gate electrode;
   c) after printing the doped glass pattern, forming the gate electrode in the gap, the gate electrode comprising a gate dielectric film and a gate conductor thereon; and
   d) diffusing a dopant from the doped glass pattern into the semiconductor thin film layer.

2. The method of claim 1, wherein forming the semiconductor thin film layer comprises printing a liquid-phase ink comprising a semiconductor-containing precursor onto a substrate.

3. The method of claim 1, wherein the doped glass formulation is printed onto or over regions of the semiconductor thin film layer corresponding to source and drain terminals of the TFT.

4. The method of claim 1, comprising printing the doped glass formulation on the semiconductor thin film layer, then forming the gate dielectric film on at least an exposed surface of the semiconductor thin film layer in the gap.

5. The method of claim 1, wherein diffusing the dopant comprises heating the doped glass pattern and the semiconductor thin film layer to a temperature and for a length of time sufficient to form a source/drain structure in the semiconductor thin film layer.

6. The method of claim 1, wherein the step of printing the doped glass formulation comprises printing an ink comprising a doped glass precursor on or over the semiconductor thin film layer, then converting the doped glass precursor ink to a doped glass.

7. The method of claim 1, further comprising removing at least portions of the doped glass pattern, sufficiently to expose surfaces of the semiconductor thin film layer containing diffused dopant.

8. The method of claim 7, wherein removing portions of the doped glass pattern leaves remaining portions of the doped glass pattern.

9. The method of claim 7, further comprising forming a conductive interconnect structure on the exposed surfaces of the semiconductor thin film layer containing diffused dopant.

10. The method of claim 7, further comprising forming an interlayer dielectric film over the doped glass pattern and the gate electrode.

11. The method of claim 1, further comprising forming a passivation layer or a dopant-depleted layer on an exposed surface of the doped glass pattern.

12. A method of forming a thin film transistor (TFT), comprising:
   a) forming a semiconductor thin film layer;
   b) prior to forming a gate electrode of the TFT, printing doped glass on or over the semiconductor thin film layer in a pattern that forms a gap in the doped glass defining a channel region and a cross-sectional width of at least part of the gate electrode;
   c) after printing the doped glass in the pattern, forming the gate electrode on or over the channel region and in the gap, the gate electrode comprising a gate dielectric film and a gate conductor thereon;
   d) diffusing a dopant from the doped glass pattern into the semiconductor thin film layer;
   e) forming a patterned interlayer dielectric film over the doped glass pattern and the gate electrode, the patterned interlayer dielectric film having an exposed upper surface; and
   f) etching the doped glass pattern using the exposed patterned interlayer dielectric film as a mask.

13. The method of claim 12, wherein etching the doped glass pattern exposes surfaces of the semiconductor thin film layer containing diffused dopant.

14. The method of claim 13, wherein etching the doped glass pattern leaves remaining portions of the doped glass pattern.

15. The method of claim 13, further comprising forming a conductive interconnect structure on the exposed surfaces of the semiconductor thin film layer containing diffused dopant.

16. The method of claim 15, wherein forming the conductive interconnect structure comprises printing an ink containing a metal precursor and converting the metal precursor to a metal.

17. The method of claim 15, further comprising printing a second interlayer dielectric film over exposed active areas.

18. The method of claim 12, wherein forming the semiconductor thin film layer comprises printing a liquid-phase ink comprising a semiconductor-containing precursor onto a substrate and converting the semiconductor-containing precursor to the semiconductor thin film.

19. The method of claim 18, wherein the semiconductor-containing precursor comprises a silane or silicon nanoparticles.

20. The method of claim 12, wherein forming the patterned interlayer dielectric film comprises printing an ink containing a dielectric precursor and converting the dielectric precursor to the patterned interlayer dielectric film.

21. The method of claim 12, wherein the etching step comprises wet etching exposed surfaces of the doped glass pattern with a HF-based wet etchant.

22. The method of claim 12, wherein the doped glass pattern is printed onto or over regions of the semiconductor thin film layer corresponding to source and drain terminals of the TFT.

23. The method of claim 12, comprising printing the doped glass pattern on the semiconductor thin film layer, then forming the gate dielectric film on at least an exposed surface of the semiconductor thin film layer in the gap.

24. The method of claim 12, wherein diffusing the dopant comprises heating the doped glass pattern and the semiconductor thin film layer to a temperature and for a length of time sufficient to form a source/drain structure in the semiconductor thin film layer.

25. The method of claim 12, wherein the step of printing the doped glass pattern comprises printing an ink comprising a doped glass precursor on or over the semiconductor thin film layer, then converting the doped glass precursor to a doped glass.

26. A method of forming a thin film transistor (TFT), comprising:
   a) forming a semiconductor thin film layer;
   b) forming a gate dielectric film on an entire surface of the semiconductor thin film layer;
   c) prior to forming a gate electrode of the TFT, printing a doped glass formulation in a pattern on or over the gate dielectric film, in a manner leaving a gap in the doped glass pattern exposing a portion of the gate dielectric film and defining a channel region and at least one dimension of at least part of the gate electrode;
   d) after printing the doped glass pattern, forming the gate electrode in the gap, the gate electrode filling a width of the gap and comprising the gate dielectric film and a gate conductor thereon; and
   e) diffusing a dopant from the doped glass pattern into the semiconductor thin film layer.

27. The method of claim 26, comprising forming the gate conductor on the gate dielectric film, at least in the gap.

28. The method of claim 27, wherein forming the gate conductor comprises printing an ink comprising a gate conductor precursor on the gate dielectric film.

* * * * *